(12) United States Patent
Tanida et al.

(10) Patent No.: US 8,269,315 B2
(45) Date of Patent: Sep. 18, 2012

(54) SEMICONDUCTOR DEVICE AND METHOD OF MANUFACTURING SEMICONDUCTOR DEVICE

(75) Inventors: Kazumasa Tanida, Kawasaki (JP); Masahiro Sekiguchi, Yokohama (JP); Kenji Takahashi, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 12/134,363

(22) Filed: Jun. 6, 2008

(65) Prior Publication Data
US 2008/0303170 A1 Dec. 11, 2008

(30) Foreign Application Priority Data
Jun. 7, 2007 (JP) .................. 2007-151151

(51) Int. Cl.
*H01L 23/48* (2006.01)
*H01L 21/768* (2006.01)

(52) U.S. Cl. ........ 257/621; 257/686; 257/774; 257/777; 257/E21.597; 438/637

(58) Field of Classification Search .................. 257/621, 257/686, 774, 777, E23.011, E21.597; 438/637
See application file for complete search history.

(56) References Cited

U.S. PATENT DOCUMENTS

| | | | |
|---|---|---|---|
| 5,229,647 A | | 7/1993 | Gnadinger |
| 6,720,661 B2 * | | 4/2004 | Hanaoka et al. ............... 257/774 |
| 7,544,973 B2 * | | 6/2009 | Wada .............................. 257/98 |
| 2002/0190371 A1 * | | 12/2002 | Mashino et al. ............... 257/690 |
| 2004/0017419 A1 * | | 1/2004 | Lai et al. .......................... 347/20 |
| 2004/0212086 A1 | | 10/2004 | Dotta et al. |
| 2005/0067713 A1 * | | 3/2005 | Mutta et al. .................... 257/774 |
| 2006/0180938 A1 * | | 8/2006 | Kurihara et al. ............... 257/773 |
| 2006/0286789 A1 * | | 12/2006 | Sunohara et al. .............. 438/598 |
| 2007/0235882 A1 * | | 10/2007 | Sekiguchi et al. ............. 257/777 |

FOREIGN PATENT DOCUMENTS

| | | |
|---|---|---|
| JP | 08-213427 | 8/1996 |
| JP | 2001-068618 | 3/2001 |
| JP | 2004-327910 | 11/2004 |
| JP | 2006-128353 | 5/2006 |
| JP | 2007-067211 | 3/2007 |

OTHER PUBLICATIONS

English Machine Translation of JP 2007-067211 retrieved on Nov. 29, 2011.*

* cited by examiner

*Primary Examiner* — Peniel M Gumedzoe
(74) *Attorney, Agent, or Firm* — Turocy & Watson, LLP

(57) ABSTRACT

A semiconductor device 1 has a through hole 3 formed in a second substrate 2. On the front surface of the semiconductor substrate 2, a first insulating layer 4 is coated having an opening 4a of the same diameter as that of the through hole 3, and a first wiring layer 5 is formed on the first insulating layer 4. Further, near the first wiring layer 5, the through hole 3 and a through connection portion constituted of a third insulating layer 8 formed on the inner surface and the like and a third wiring layer 9 filled and formed in the through hole 3 are formed. In addition, a second wiring layer 7 internally contacting the through connection portion is electrically connected with the first wiring layer 5. Between the inner surface of the through hole 3 and the first wiring layer 5, a second insulating layer 6 intervenes so that the first wiring layer 5 is separated from the third wiring layer 9 filled and formed in the through hole 3.

2 Claims, 14 Drawing Sheets

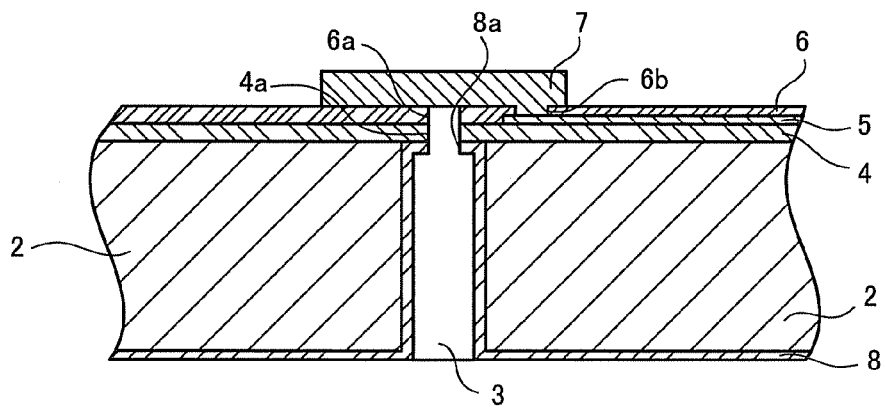
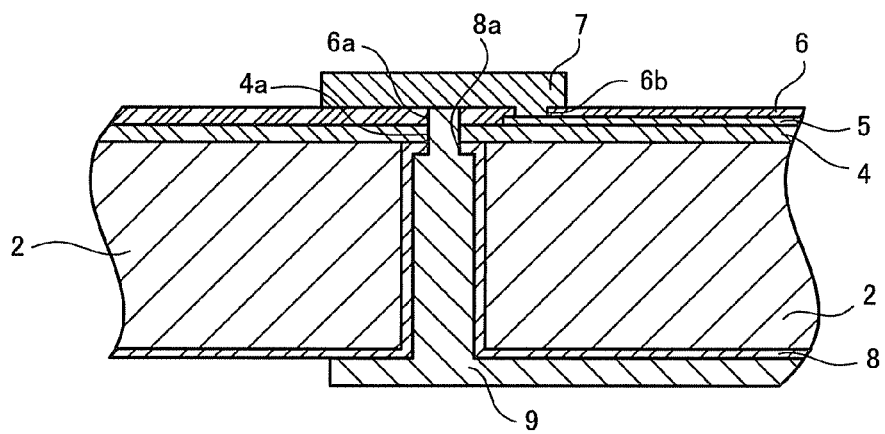
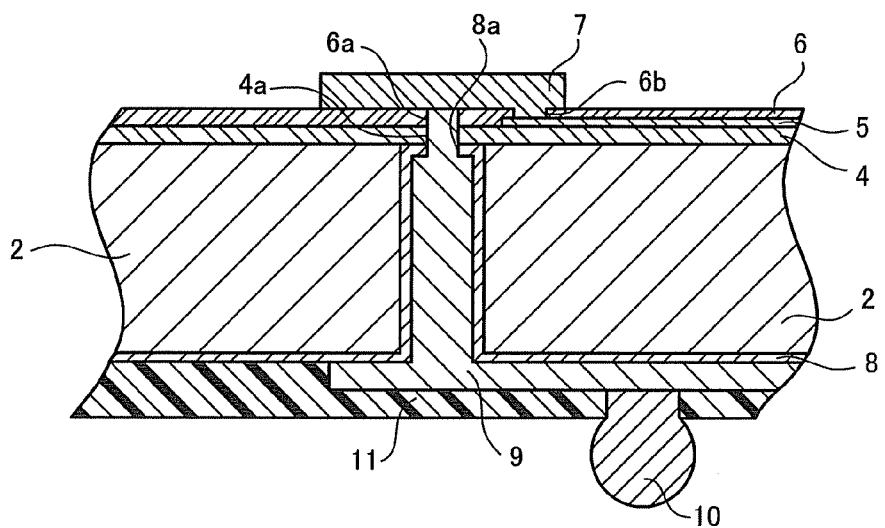

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2007-151151, filed on Jun. 7, 2007; the entire contents of which are incorporated herein by reference.

BACKGROUND OF THE INVENTION

1. Field of the Invention

The present invention relates to a semiconductor device and a method of manufacturing a semiconductor device and, more specifically, to a semiconductor device having a through connection portion for electrically connecting wirings on the front and rear surfaces of a semiconductor substrate and a method manufacturing thereof.

2. Description of the Related Art

It is proposed, in a memory device using a semiconductor integrated circuit, to layer memory chips (semiconductor chips) at multiple tiers to enhance the memory capacity. The semiconductor chip is formed with a through hole penetrating through its front and rear surfaces, a conductor layer is formed in the through hole, and a metal bump conducted to the conductor layer is formed on the rear surface of the chip. The metal bump of the semiconductor chip at the upper tier is bonded to a metal pad formed on the front surface of the semiconductor chip at the lower tier, thus electrically connecting the integrated circuit of the memory chip at the upper tier to the integrated circuit of the memory chip at the lower tier.

As a semiconductor device having such a through connection portion, a device has conventionally been proposed which has a structure in which a through hole is formed by etching from the rear surface of a semiconductor substrate so that wirings on the front surface and rear surface of the semiconductor substrate are electrically connected via a conduction portion formed in the through hole (see, for example, U.S. Pat. No. 5,229,647 and Japanese Patent No. 3,186,941, and JP-A 2001-68618 (KOKAI)).

Hereinafter, a conventional semiconductor device is described. In a conventional semiconductor device 100 shown in FIG. 8, a semiconductor substrate 101 made of silicon has a through hole 102 penetrating through its front and rear surfaces, and an insulating film 103 is formed from on an inner wall surface of the through hole 102 to on the rear surface of the semiconductor substrate 101. In addition, a through wiring layer 104 is formed in the through hole 102. The through wiring layer 104 electrically connects a wiring layer (a front surface side wiring layer) 105 formed on the front surface side of the semiconductor substrate 101 to an external terminal (a solder ball) 106 formed on the rear surface side. On the front surface side of the semiconductor substrate 101, an insulating layer (a front surface side insulating layer) 107 is formed, on which the front surface side wiring layer 105 is formed, and a front surface side protective film 108 is further formed on the front surface side wiring layer 105. On the front surface side of the semiconductor substrate 101, a semiconductor device such as an image sensor or the like is formed of an integrated circuit. On the rear surface side of the semiconductor substrate 101, the external terminal 106 connected to the through wiring layer 104 and a rear surface side protective film 109 are formed. The external terminal 106 is formed to protrude to the outside.

In this semiconductor device 100, the through hole 102, an opening 107a of the front surface side insulating layer 107, and an opening 103a of the insulating film 103 have the same shape and substantially the same diameter and are formed as described below. Specifically, the through hole 102 is formed by etching the semiconductor substrate 101 using a predetermined mask pattern (not shown) from its rear surface side until the front surface side insulating layer 107 is exposed. Subsequently, using the formed through hole 102 as a mask, the front surface side insulating layer 107 is etched by the etching method with a greater selection ratio than that of the semiconductor substrate 101, whereby the opening 107a of the front surface side insulating layer 107 is formed. Further, the rear surface side insulating film 103 is formed on the inner wall surface of the through hole 102 and on the rear surface of the semiconductor substrate 101 such that the insulating film 103 has a larger film thickness on the rear surface side of the semiconductor substrate 101 than on the bottom surface and the inner wall surface of the through hole 102, and the rear surface side insulating film 103 is etched back using the anisotropic etching. Thus, the insulating film 103 on the bottom surface of the through hole 102 is removed to expose the wiring layer 105.

However, in the semiconductor device 100 manufactured in such a method, the exposed wiring layer 105 on the front surface side has been thinned during opening the front surface side insulating layer 107 and the rear surface side insulating film 103, resulting in decreased mechanical reliability. Further, another problem is that more thinning results in a loss of a portion of the wiring layer 105 to cause a poor connection with the through wiring layer 104, leading to a reduced yield.

BRIEF SUMMARY OF THE INVENTION

A semiconductor device according to an aspect of the present invention comprises: a semiconductor substrate; a through hole formed penetrating through a first surface and a second surface of said semiconductor substrate; a first insulating layer having an opening above an opening portion on the first surface side of said through hole, formed on the first surface of said semiconductor substrate; a first conductor layer in a pattern formed in a region where the opening is not formed on said first insulating layer; a second insulating layer having an opening above the opening portion on the first surface side of said through hole, formed to cover said first conductor layer and said first insulating layer in a region where said first conductor layer is not formed; a second conductor layer electrically connected with said first conductor layer, formed on said second insulating layer to cover the opening of said second insulating layer; a third insulating layer having an opening, continuously formed from on an inner surface of said through hole to on the second surface of said semiconductor substrate; and a third conductor layer internally contacting said second conductor layer via the opening of said third insulating layer, continuously formed in said through hole and on said third insulating layer on the second surface of said semiconductor substrate.

A semiconductor device according to another aspect of the present invention comprises: a semiconductor substrate; a through hole formed penetrating through a first surface and a second surface of said semiconductor substrate; a first insulating layer having an opening above an opening portion on the first surface side of said through hole, formed on the first surface of said semiconductor substrate; a first conductor layer having an opening larger in diameter than the opening of said first insulating layer, the opening of the first conductor layer being formed coaxially above the opening portion on the first surface side of said through hole, formed on said first insulating layer; a second insulating layer having an opening smaller in diameter than the opening of said first conductor layer, the opening of the second insulating layer being formed coaxially above the opening portion on the first surface side of said through hole, formed to cover said first conductor layer and said first insulating layer in a region where said first conductor layer is not formed; a second conductor layer electrically connected with said first conductor layer, formed on said second insulating layer to cover the opening of said second insulating layer; a third insulating layer having an opening, continuously formed from on an inner surface of said through hole to on the second surface of said semiconductor substrate; and a third conductor layer internally contacting said second conductor layer via the opening of said third insulating layer, continuously formed in said through hole and on said third insulating layer on the second surface of said semiconductor substrate.

A method of manufacturing a semiconductor device according to an aspect of the present invention comprises: forming a first insulating layer on a first surface of a semiconductor substrate; forming a pattern of a first conductor layer on the first insulating layer; forming a second insulating layer having a connection opening portion, on the pattern of the first conductor layer; forming a second conductor layer electrically connected to the first conductor layer via the connection opening portion of the second insulating layer, on the second insulating layer; forming a through hole from a second surface side to the first surface side of the semiconductor substrate; forming openings in the first insulating layer and in the second insulating layer formed thereon coaxially with the through hole to expose the second conductor layer; forming a third insulating layer from on an inner surface of the through hole to on the second surface of the semiconductor substrate; forming an opening in the third insulating layer continuously and coaxially with the through hole; and forming a third conductor layer to internally contact the second conductor layer via the opening of the third insulating layer, from on the third insulating layer in the through hole to on the third insulating layer on the second surface of the semiconductor substrate.

BRIEF DESCRIPTION OF THE DRAWINGS

FIG. 4A to FIG. 4D are cross-sectional views illustrating a method of manufacturing the semiconductor device according to the second embodiment of the present invention.

DETAILED DESCRIPTION OF THE INVENTION

Hereinafter, embodiments for implementing the present invention will be described. Note that the embodiments will be explained in the following description with reference to the drawings, which are presented for purpose of understanding but not intended to limit the present invention.

Figure 1:
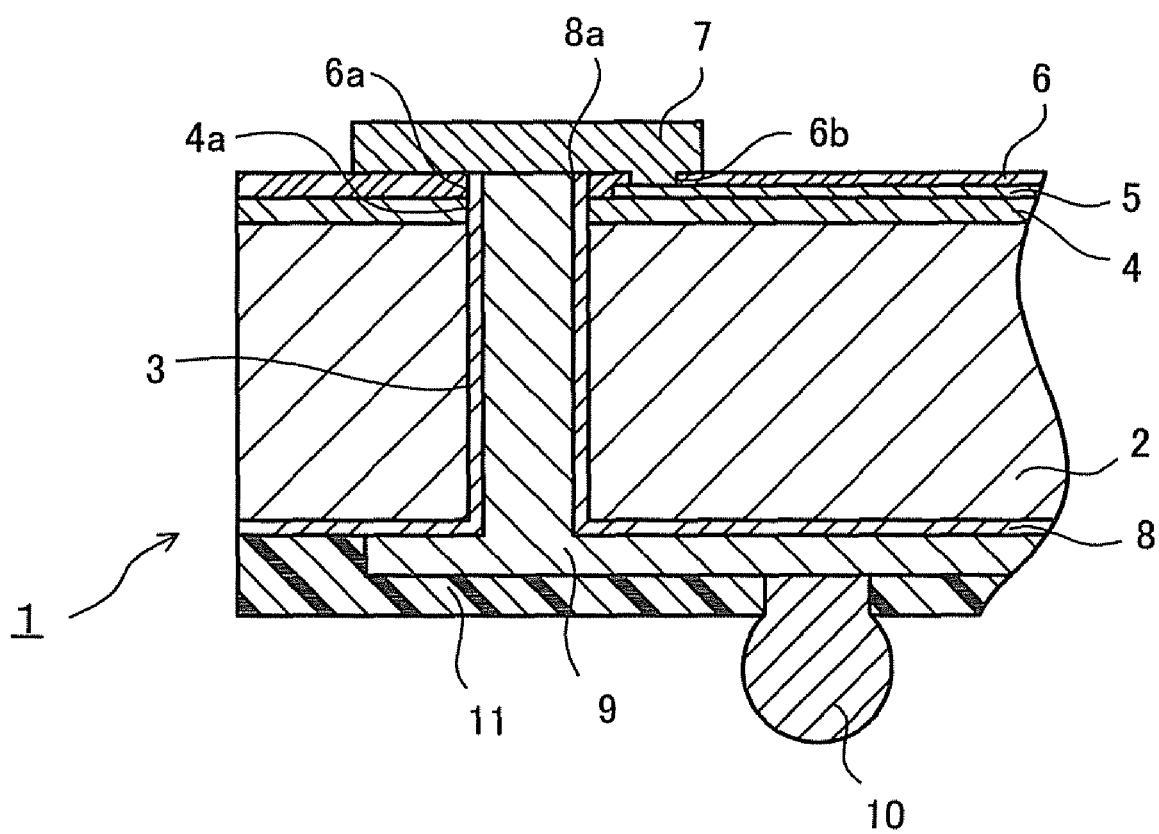
FIG. 1 is a cross-sectional view showing a configuration of a semiconductor device according to a first embodiment of the present invention.

FIG. 1 is a cross-sectional view showing a configuration of a semiconductor device according to a first embodiment of the present invention, and FIG. 2A to FIG. 2J are cross-sectional views showing steps of a method of manufacturing the semiconductor device of the first embodiment.

As shown in FIG. 1, a semiconductor device 1 of the first embodiment has a semiconductor substrate 2 such as a silicon substrate, and the semiconductor substrate 2 has a through hole 3 formed penetrating through a front surface (element region formation surface) being its first surface and a rear surface being its second surface. A first insulating layer 4 with an opening 4a having the same diameter as that of the through hole 3 above the through hole 3 is formed on the front surface of the semiconductor substrate 2, and a first wiring layer 5 is formed on the first insulating layer 4. The first wiring layer 5 is formed in a pattern form (island form) near the opening 4a of the first insulating layer 4. On the first wiring layer 5 and above the first insulating layer 4 thereunder, a second insulating layer 6 is formed which has an opening 6a having the same diameter as that of the opening 4a above the opening 4a of the first insulating layer 4. The second insulating layer 6 has, on the first wiring layer 5, a connection opening portion 6b between the first wiring layer 5 and the second wiring layer described later.

Moreover, on the first insulating layer 4, a second wiring layer 7 is formed to overlie and close (to cover) the opening 4a of the first insulating layer 4 and the opening 6a of the second insulating layer 6. The second wiring layer 7 is electrically connected with the first wiring layer 5 thereunder via tahe connection opening portion 6b of the second insulating layer 6, and formed protruding from the upper surface of the second insulating layer 6. A third insulating layer 8 is formed on the inner wall surface of the through hole 3 including the inner surface of the opening 4a of the first insulating layer 4 and the opening 6a of the second insulating layer 6 and on the rear surface of the semiconductor substrate 2. The third insulating layer 8 is formed to internally contact the second wiring layer 7, and has an opening 8a in this internal contact portion. This opening 8a may have substantially the same diameter as those of the opening 4a of the first insulating layer 4 and the opening 6a of the second insulating layer 6, or may have a diameter smaller than those.

Further, a third wiring layer 9 is formed to fill the through hole 3. This third wiring layer 9 is formed from the inside of the through hole 3 to on the third insulating layer 8 on the rear surface of the semiconductor substrate 2 such that the third wiring layer 9 internally contacts the second wiring layer 7 via the opening 8a of the third insulating layer 8. Moreover, an external terminal 10 is disposed on the third wiring layer 9 on the rear surface of the semiconductor substrate 2. On the rear surface of the semiconductor 2, a protective layer (rear surface side protective layer) 11 is coated on the third wiring layer 9 except the portion where the external terminal 10 is disposed and on the third insulating layer 8.

The semiconductor device 1 of the first embodiment configured as described above is manufactured as described below. Specifically, in a first step shown in FIG. 2A, the first insulating layer 4 is formed on the front surface (a first surface) of the semiconductor substrate 2 by the CVD (Chemical Vapor Deposition) method, spin coating method, spray coating method or the like. The first insulating layer 4 is composed, for example, of silicon oxide ($SiO_2$), silicon nitride ($SiN_x$), SiOF (Fluorine-doped $SiO_2$), porous SiOC (Carbon-doped $SiO_2$) or the like.

Figure 2A:
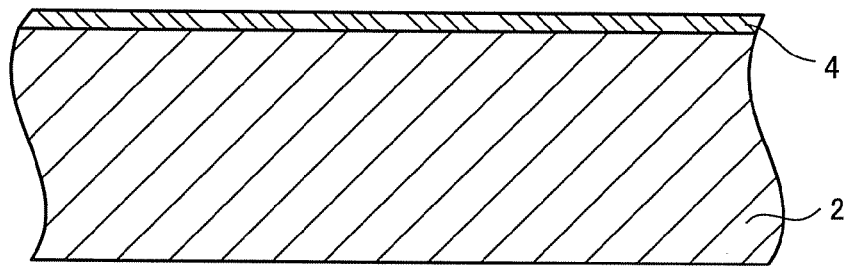
FIG. 2A to FIG. 2J are cross-sectional views illustrating a method of manufacturing the semiconductor device according to the first embodiment of the present invention.
Figure 2B:
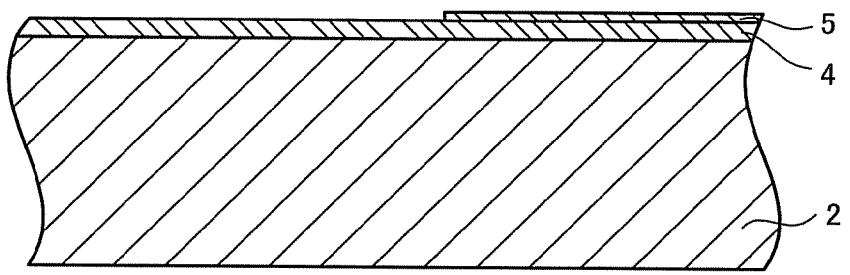

Then, in a second step shown in FIG. 2B, on the first insulating layer 4, the first wiring layer 5 is formed by the sputtering method, CVD method, vapor deposition method, plating method or the like using a mask in a predetermined pattern (not shown). The first wiring layer 5 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag or the like), or has a structure in which a plurality of layers comprised of the above-described materials are layered.

Figure 2C:
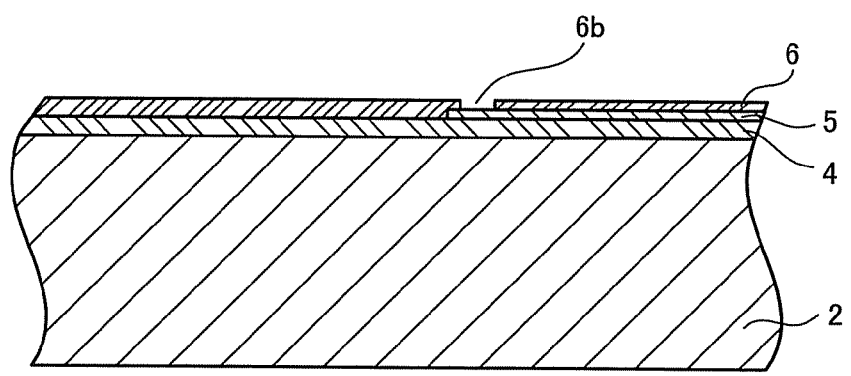

Subsequently, in a third step shown in FIG. 2C, on the first wiring layer 5 and on or above the first insulating layer 4, the second insulating layer 6 having the connection opening portion 6b at a predetermined position (on the first wiring layer 5) is formed by the CVD method, spin coating method, spray coating method or the like. The second insulating layer 6 is comprised of, for example, silicon oxide, silicon nitride, SiOF, porous SiOC or the like.

Figure 2D:
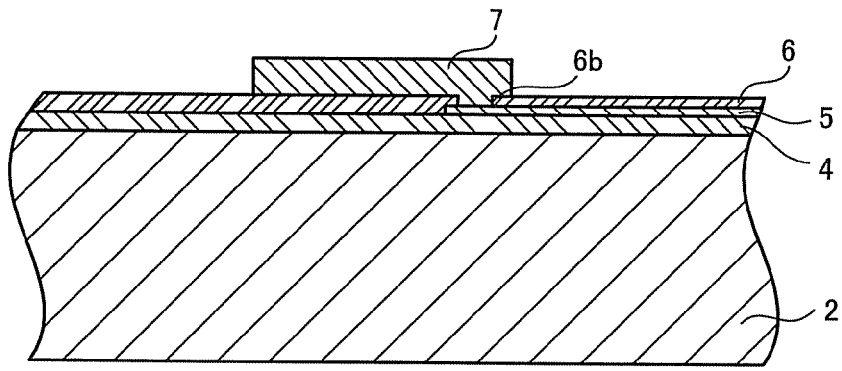

In a fourth step shown in FIG. 2D, on the second insulating layer 6, the second wiring layer 7 which is in electrical contact with the first wiring layer 5 via the connection opening portion 6b, is formed by the sputtering method, CVD method, vapor deposition method, plating method or the like using a mask in a predetermined pattern (not shown). The second wiring layer 7 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag or the like), or has a structure in which a plurality of layers comprised of the above-described materials are layered.

Figure 2E:
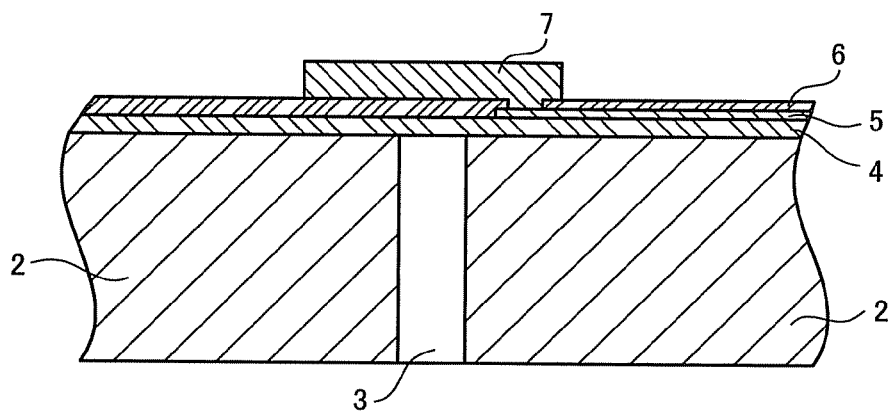

In a fifth step shown in FIG. 2E, the through hole 3 is formed, in a region where the first wiring layer 5 is not formed and in a region direct below the second wiring layer 7, by the plasma etching method using a mask in a predetermined pattern (not shown) from the rear surface side of the semiconductor substrate 2 so as to expose the first insulating layer 4 at the bottom of the through hole 3. Note that the through hole 3 is preferably formed near the electrical contact portion between the first wiring layer 5 and the second wiring layer 7. Further, the through hole 3 preferably has a cross section exhibiting a tapered shape decreasing in diameter toward the first insulating layer 4. In the formation of the through hole 3, the plasma etching is performed by introducing an etching gas into plasma so that the semiconductor substrate 2 is etched more greatly than the first insulating layer 4. Used as the etching gas is, for example, a mixed gas of $SF_6$ and $O_2$ and Ar for the case where the semiconductor substrate 2 is a silicon (Si) substrate and the first insulating layer 4 is a $SiO_2$ film.

Figure 2F:
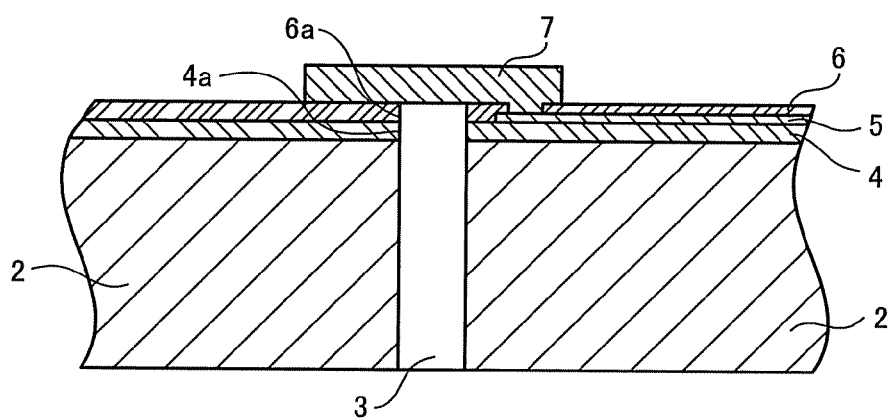

Subsequently, in a sixth step shown in FIG. 2F, the openings 4a and 6a are continuously formed by the plasma etching in the portion of the first insulating layer 4 exposed by the formation of the through hole 3 and in the second insulating layer 6 thereon to expose the second wiring layer 7. The plasma etching is performed by introducing an etching gas (for example, a mixed gas of $C_5F_8$ and $O_2$ and Ar in the case where the first insulating layer 4 is a $SiO_2$ film, the second insulating layer 6 is a $SiO_2$ film, the semiconductor substrate 2 is a silicon substrate, and the second wiring layer 7 is comprised of TiW or Au) into plasma so that the first insulating layer 4 and the second insulating layer 6 are etched more greatly than the semiconductor substrate 2 and the second wiring layer 7.

Alternatively, the above-described fifth step and sixth step can be performed together by the laser etching method without using the mask. Used as a laser light source is, for example, a YAG (yttrium aluminum garnet) laser, UV (solid ultraviolet) laser, excimer laser, carbon dioxide gas ($CO_2$) laser or the like. The frequency band of the YAG laser is 355 nm, the frequency band of the UV laser is 213 nm and 266 nm (CLBO: cesium lithium triborate crystal), 355 nm (CBO: cesium triborate crystal, LBO: lithium triborate crystal), and the frequency band of the excimer laser is 193 nm (ArF), 248 nm (KrF), 308 nm (XeCl), and 351 nm (XeF). Where the semiconductor substrate 2 is a silicon substrate, the first insulating layer 4 is a $SiO_2$ film, and the second insulating layer 6 is a $SiO_2$ film, the YAG laser with a frequency of 355 nm is preferably used as the laser light source.

Figure 2G:
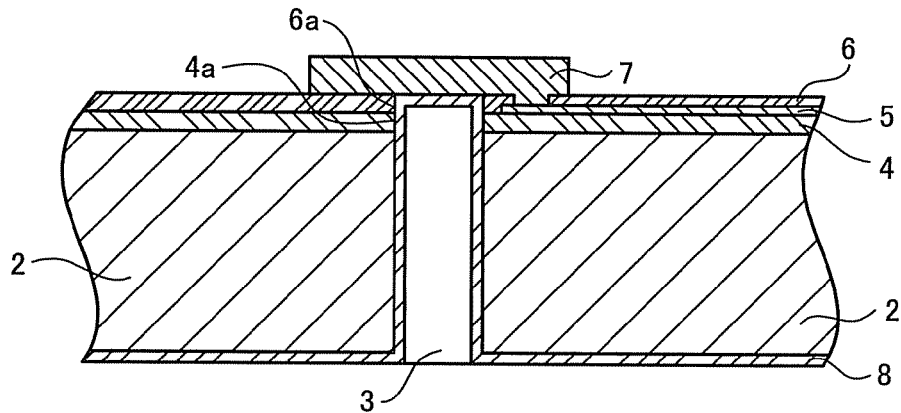

Subsequently, in a seventh step shown in FIG. 2G, the third insulating layer 8 is formed by the CVD method, spray coating method, spin coating method, film laminating method or the like, to cover the bottom surface (the exposed portion of the second wiring layer 7) and the inner wall surface of the through hole 3 to the rear surface of the semiconductor substrate 2. The third insulating layer 8 is composed of, for example, silicon oxide, silicon nitride, polyimide resin, BCB (benzocyclobutene) resin, epoxy resin or the like.

Figure 2H:
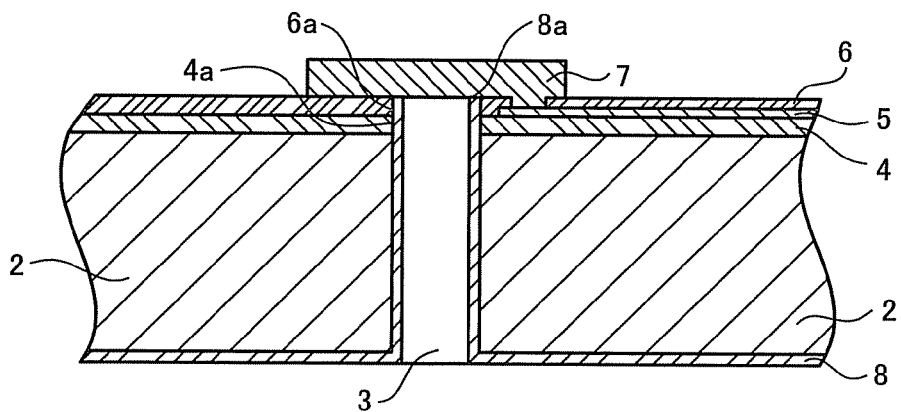

In an eighth step shown in FIG. 2H, the opening 8a having substantially the same diameter as those of the openings 4a and 6a of the first insulating layer 4 and the second insulating layer 6 is formed in the third insulating layer 8 formed on the bottom surface of the through hole 3 by the plasma etching using a mask in a predetermined pattern (not shown) to expose again the second wiring layer 7. In the formation of the opening 8a, the plasma etching is performed by introducing an etching gas (for example, a mixed gas of $C_5F_8$ and $O_2$ and Ar in the case where the third insulating layer 8 is a $SiO_2$ film, the second wiring layer 7 is comprised of TiW or Au) into plasma so that the third insulating layer 8 is etched more greatly than the second wiring layer 7.

Figure 2I:
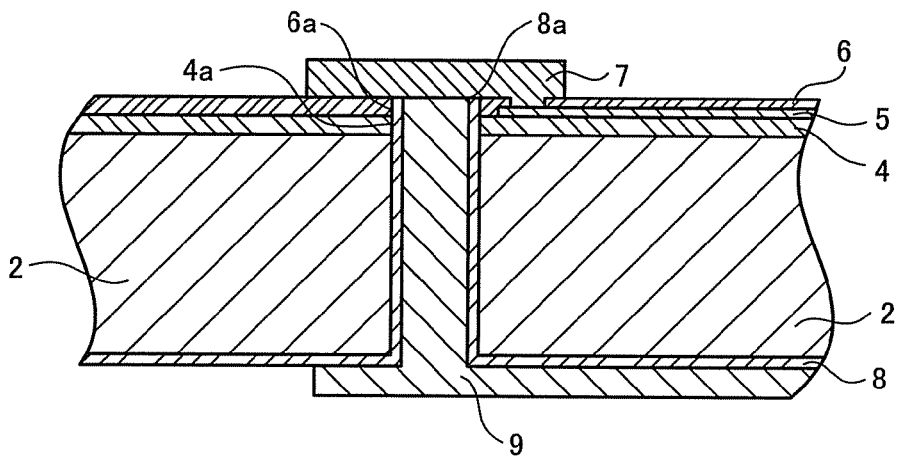

Subsequently, in a ninth step shown in FIG. 2I, the third wiring layer 9 is formed from on the third insulating layer 8 in the through hole 3 to on the third insulating layer 8 on the rear surface of the semiconductor substrate 2 to internally contact the second wiring layer 7 via the opening 8a of the third insulating layer 8. The third wiring layer 9 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag, solder or the like), or has a structure in which a plurality of layers comprised of the above-described materials are layered. The formation of the third wiring layer 9 is preferably performed by the sputtering method, CVD method, vapor deposition method, plating method, printing method or the like using a mask in a predetermined pattern (not shown) to fill the inside of the through hole 3.

Figure 2J:
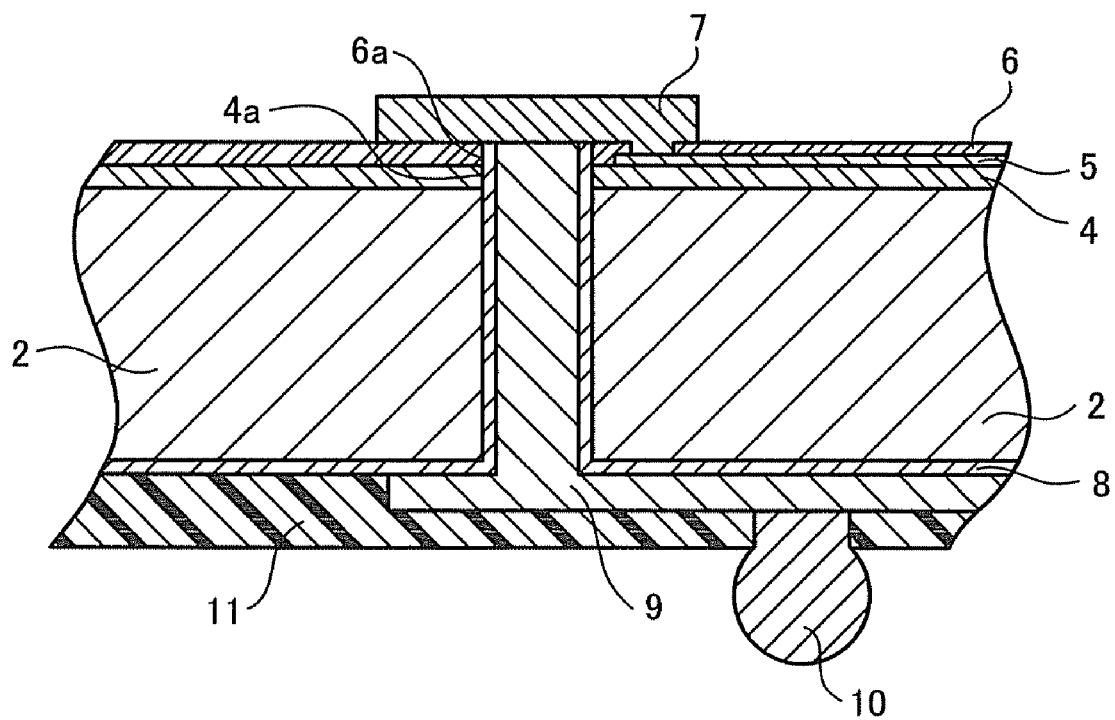

Then, in a tenth step shown in FIG. 2J, the external terminal 10 is formed on the third wiring layer 9 on the rear surface of the semiconductor substrate 2, and the protective layer 11 is formed on the third wiring layer 9 except the portion where the external terminal 10 is formed and on the third insulating layer 8 on the rear surface side. The external terminal 10 is formed of, for example, a solder material, and the protective layer 11 is formed of a polyimide resin, epoxy resin or solder resist material. Subsequently, the semiconductor substrate 2 is diced by a cutting blade of a dicer. Thus, the individual piece of the semiconductor device 1 shown in FIG. 1 is obtained.

In the semiconductor device 1 of the first embodiment manufactured as described above, the through connection portion constituted of the through hole 3, the third insulating layer 8 formed on its inner wall surface thereof and the third wiring layer 9 filled and formed in the through hole 3 are formed near the first wiring layer 5 formed on the front surface side of the semiconductor substrate 2, and the second wiring layer 7 internally contacting the through connection portion is connected with the first wiring layer 5 via the connection opening portion 6b formed in the second insulating layer 6. As described above, at the opening portion on the front surface side of the through hole 3, the second insulating layer 6 is formed to intervene between the inner wall surface of the through hole 3 and the first wiring layer 5 so that the first wiring layer 5 is separated from the third wiring layer 9 filled and formed in the through hole 3, thereby preventing the wiring layer 5 from being eroded during opening of the first insulating layer 4 and the second insulating layer 6, resulting in increased yields. The separation distance between the first wiring layer 5 and the third wiring layer 9 that is equal to or greater than 50 nm when the second insulating layer 6 is comprised of, for example, $SiO_2$ prevents occurrence of electrostatic breakdown between the third wiring layer 9 and the first wiring layer 5, resulting in excellent electrical reliability. Further, the second wiring layer 7 is formed protruding above from the second insulating layer 6 and thus functions as a reinforcing structure at the opening portion on the front surface side of the through hole 3, thereby presenting a semiconductor device having excellent mechanical reliability.

Next, a second embodiment of the present invention will be described.

Figure 3:
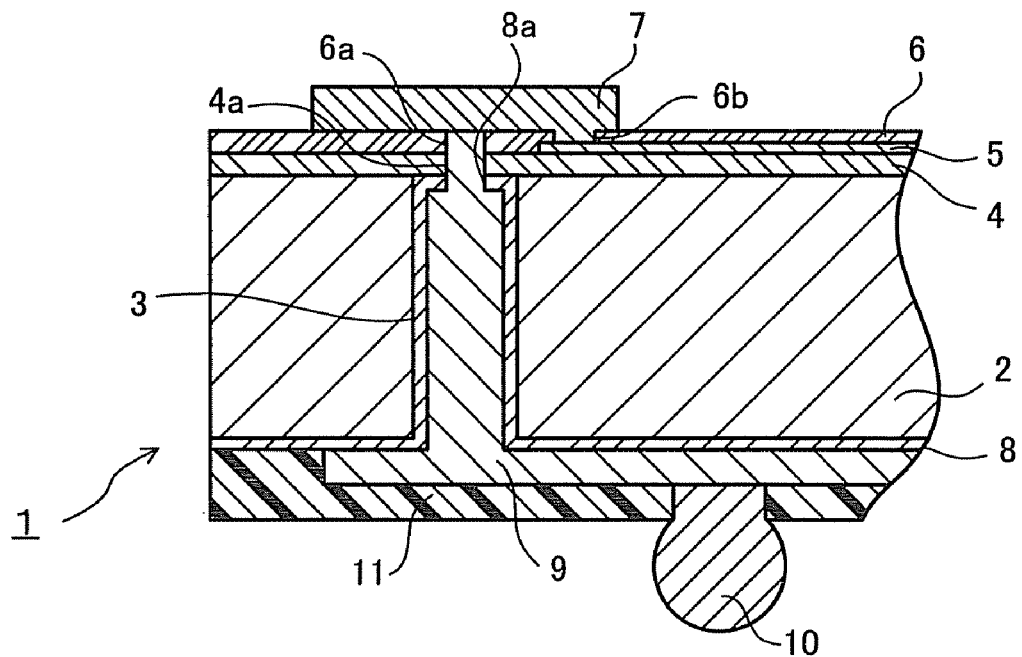
FIG. 3 is a cross-sectional view showing a configuration of a semiconductor device according to a second embodiment of the present invention.

As shown in FIG. 3, in a semiconductor device 1 of the second embodiment, an opening 4a of a first insulating layer 4 and an opening 6a of a second insulating layer 6 are formed smaller than the diameter (the inner diameter) of a through hole 3, and are formed coaxially with the through hole 3 (having the same central axis). Further, a third insulating layer 8 is formed to internally contact the first insulating layer 4 and has, in the internal contact portion, an opening 8a having the same diameter as those of the opening 4a of the first insulating layer 4 and the opening 6a of the second insulating layer 6. Further, the opening 8a of the third insulating layer 8 is formed coaxially with the opening 4a of the first insulating layer 4 and the opening 6a of the second insulating layer 6. The remaining configuration in the semiconductor device 1 of the second embodiment is the same as that of the first embodiment shown in FIG. 1, and therefore the description thereof will be omitted.

Figure 4A:
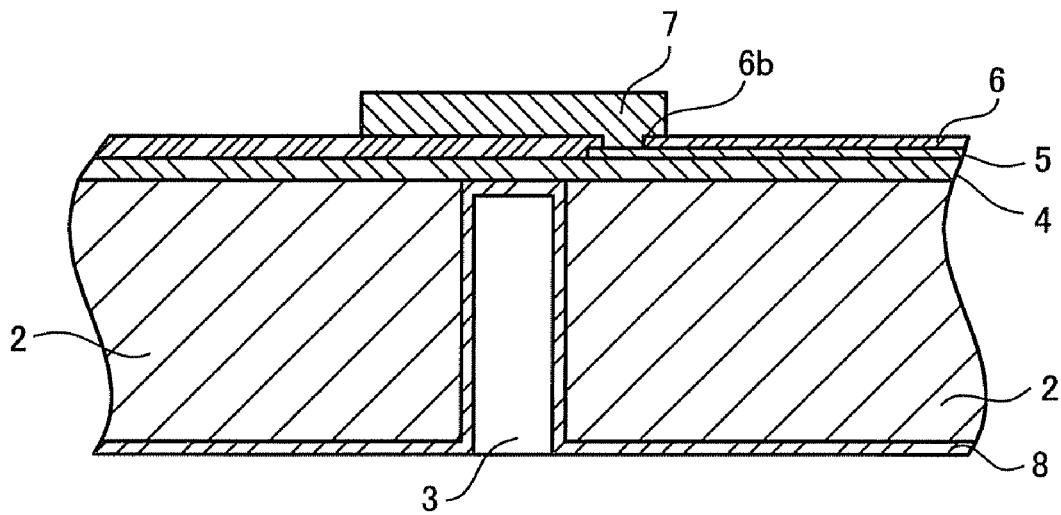

The semiconductor device 1 of the second embodiment is manufactured as described below. Specifically, after implementation of the process similar to the first to fifth steps (shown in FIG. 2A to FIG. 2E) in the method of manufacturing the semiconductor device 1 of the first embodiment, the third insulating layer 8 is formed by the CD method, spray coating method, spin coating method, film laminating method or the like, to cover the bottom surface of the through hole 3 (the exposed portion of the first insulating layer 4) and the inner wall surface of the through hole 3 and the rear surface of the semiconductor substrate 2 as shown in FIG. 4A. The third insulating layer 8 is composed of, for example, silicon oxide, silicon nitride, polyimide resin, BCB (benzocyclobutene) resin, epoxy resin or the like.

Subsequently, the openings 8a, 4a and 6a having a diameter smaller than that of the through hole 3 are continuously formed in the third insulating layer 8 formed on the bottom surface of the through hole 3 and the first insulating layer 4 and the second insulating layer 6 on or above the third insulating layer 8 by the plasma etching using a mask in a predetermined pattern (not shown) to expose the second wiring layer 7. The plasma etching is performed by introducing an etching gas (for example, a mixed gas of $C_5F_8$ and $O_2$ and Ar in the case where the third insulating layer 8 is a $SiO_2$ film, the first insulating layer 4 is a $SiO_2$ film, the second insulating layer 6 is a $SiO_2$ film, the semiconductor substrate 2 is a silicon substrate, and the second wiring layer 7 is comprised of TiW or Au) into plasma so that the third insulating layer 8, the first insulating layer 4, and the second insulating film 6 are etched more greatly than the semiconductor substrate 2 and the second wiring layer 7.

The formation of the opening 8a of the third insulating layer 8, the opening 4a of the first insulating layer 4 and the opening 6a of the second insulating layer 6 can also be performed by the plasma etching method without using the mask. Further, the formation of the openings 8a, 4a, and 6a can be performed collectively (simultaneously) by the laser etching method without using the mask. Used as a laser light source is, for example, a YAG laser, UV laser, excimer laser, carbon dioxide gas ($CO_2$) laser or the like. Where the semiconductor substrate 2 is a silicon substrate, the third insulating layer 8 is a $SiO_2$ film, the first insulating layer 4 is a $SiO_2$ film, and the second insulating layer 6 is a $SiO_2$ film, the YAG laser with a frequency of 355 nm is preferably used as the laser light source.

Subsequently, in a step shown in FIG. 4C, the third wiring layer 9 is formed from on the third insulating layer 8 in the through hole 3 to on the third insulating layer 8 on the rear surface of the semiconductor substrate 2 to internally contact the second wiring layer 7 via the opening 8a of the third insulating layer 8, the opening 4a of the first insulating layer 4, and the opening 6a of the second insulating layer 6. The third wiring layer 9 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag, solder or the like), or has a structure in which a plurality of layers comprised of the above-described materials are layered. The formation of the third wiring layer 9 is preferably performed by the sputtering method, CVD method, vapor deposition method, plating method, printing method or the like using a mask in a predetermined pattern (not shown) to fill the inside of the through hole 3.

Then, in a step shown in FIG. 4D, an external terminal 10 is formed on the third wiring layer 9 on the rear surface of the semiconductor substrate 2, and a protective layer 11 is formed on the third wiring layer 9 except the portion where the external terminal 10 is formed and on the third insulating layer 8 on the rear surface side. The external terminal 10 is formed of, for example, a solder material, and the protective layer 11 is formed of a polyimide resin, epoxy resin or solder resist material. Subsequently, the semiconductor substrate 2 is diced by a cutting blade of a dicer. Thus, the individual piece of the semiconductor device 1 shown in FIG. 3 is obtained.

In the semiconductor device 1 of the second embodiment manufactured as described above, the opening 4a of the first insulating layer 4 and the opening 6a of the second insulating layer 6 are formed smaller than the diameter of the through hole 3, so that the second insulating layer 6 intervening between the inner wall surface of the through hole 3 and the first wiring layer 5 separates the first wiring layer 5 further from the third wiring layer 9 filled and formed in the through hole 3 than in the first embodiment. This more reliably prevents the first wiring layer 5 from being eroded during opening of the first insulating layer 4 and the second insulating layer 6, resulting in further increased yields than in the first embodiment. The separation distance between the first wiring layer 5 and the third wiring layer 9 that is equal to or greater than 50 nm when the second insulating layer 6 is comprised of, for example, $SiO_2$ prevents occurrence of electrostatic breakdown between the third wiring layer 9 and the first wiring layer 5, resulting in excellent electrical reliability.

Next, a third embodiment of the present invention will be described.

Figure 5:
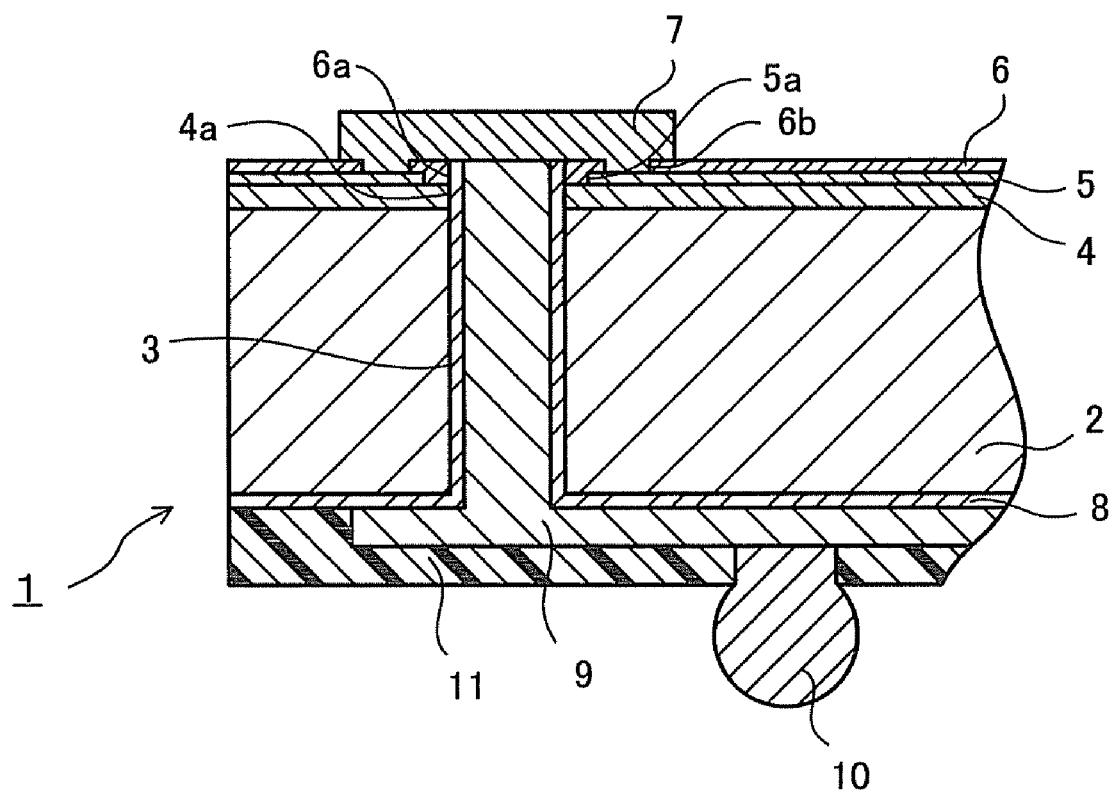
FIG. 5 is a cross-sectional view showing a configuration of a semiconductor device according to a third embodiment of the present invention.

FIG. 5 is a cross-sectional view showing a configuration of a semiconductor device according to a third embodiment of the present invention, and FIG. 6A to FIG. 6J are cross-sectional views showing a method of manufacturing the semiconductor device of the third embodiment. Note that in these drawings, the same numerals are given to the same portions as those in FIG. 1 and FIG. 2A to FIG. 2J.

As shown in FIG. 5, the semiconductor device 1 of the third embodiment has a semiconductor substrate 2 such as a silicon substrate, and the semiconductor substrate 2 has a through hole 3 formed penetrating through a front surface and a rear surface. A first insulating layer 4 with an opening 4a having the same diameter as that of the through hole 3 above the through hole 3 is formed on the front surface of the semiconductor substrate 2, and a first wiring layer 5 is formed on the first insulating layer 4. The first wiring layer 5 has an opening 5a larger in diameter than the opening 4a of the first insulating layer 4, the opening 5a being formed coaxially with the opening 4a of the first insulating layer 4. Further, on the first wiring layer 5 and above the first insulating layer thereunder, a second insulating layer 6 is formed. The second insulating layer 6 has an opening 6a above the opening 4a of the first insulating layer 4, having a diameter the same as that of the opening 4a and smaller than that of the opening 5a of the first wiring layer 5. More specifically, the second insulating layer 6 is formed to cover the top of the first insulating layer 4 exposed inside the opening 5a of the first wiring layer 5, and has the opening 6a having the same diameter as the opening 4a of the first insulating layer 4 at a position above the through hole 3 of the semiconductor substrate 2. The second insulating layer 6 also has an annular connection opening portion 6b to surround the outer side of the opening 6a. This connection opening portion 6b is an opening for forming a conduction path for electrically connecting the first wiring layer 5 to a later-described second wiring layer, and is formed in a region on the first wiring layer 5. The connection opening portion 6b may not necessarily be annular as long as sufficient electrical connection can be obtained therethrough.

Moreover, on the second insulating layer 6, a second wiring layer 7 is formed to overlie the opening 6a and the opening 4a of the first insulating layer 4. The second wiring layer 7 is electrically connected with the first wiring layer 5 thereunder via the annular connection opening portion 6b formed in the second insulating layer 6, and formed protruding from the upper surface of the second insulating layer 6. Moreover, a third insulating layer 8 is formed on the inner wall surface of the through hole 3 including the inner surface of the opening 4a of the first insulating layer 4 and the opening 6a of the second insulating layer 6 and on the rear surface of the semiconductor substrate 2. The third insulating layer 8 is formed to internally contact the second wiring layer 7, and has an opening 8a in this internal contact portion. This opening 8a may have substantially the same diameter as those of the openings 4a and 6a of the first insulating layer 4 and the second insulating layer 6, or may have a diameter smaller than those.

Further, a third wiring layer 9 is filled and formed in the through hole 3. This third wiring layer 9 is formed from the inside of the through hole 3 to on the third insulating layer 8 on the rear surface of the semiconductor substrate 2 such that the third wiring layer 9 internally contacts the second wiring layer 7 via the opening 8a of the third insulating layer 8. Moreover, an external terminal 10 is formed on the third wiring layer 9 on the rear surface of the semiconductor substrate 2, and on the rear surface of the semiconductor 2, a protective layer 11 is coated on the third wiring layer 9 except the portion where the external terminal 10 is disposed and on the third insulating layer 8.

The semiconductor device 1 of the third embodiment configured as described above is manufactured as described below. Specifically, in a first step shown in FIG. 6A, the first insulating layer 4 is formed on the front surface of the semiconductor substrate 2 by the CVD method, spin coating method, spray coating method or the like. The first insulating layer 4 is composed, for example, of silicon oxide ($SiO_2$), silicon nitride ($SiN_x$), SiOF, porous SiOC or the like.

Figure 6A:
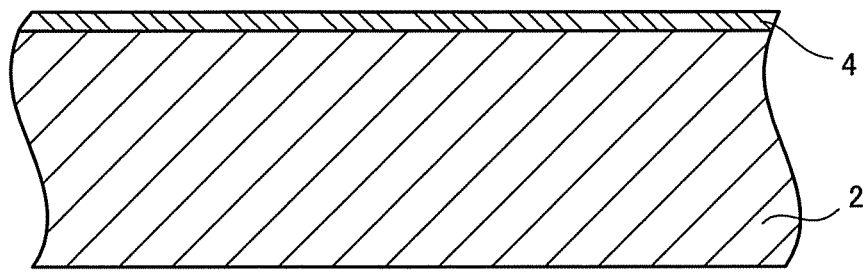
FIG. 6A to FIG. 6J are cross-sectional views illustrating a method of manufacturing the semiconductor device according to the third embodiment of the present invention.
Figure 6B:
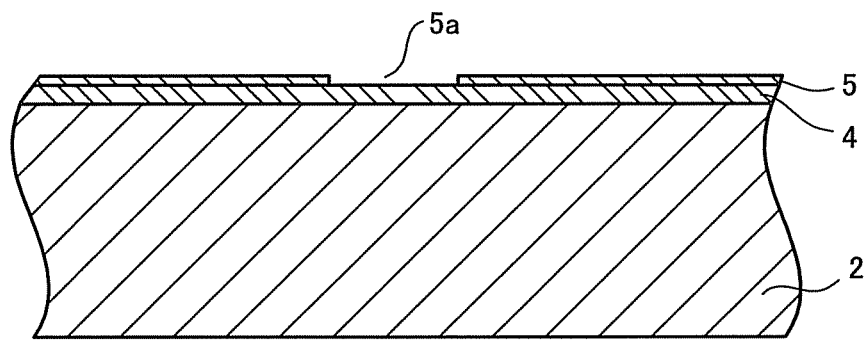

Then, in a second step shown in FIG. 6B, on the first insulating layer 4, the first wiring layer 5 having a large diameter opening 5a is formed by the sputtering method, CVD method, vapor deposition method, plating method or the like using a mask in a predetermined pattern (not shown). The first wiring layer 5 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag or the like), or has a structure in which a plurality of layers comprised of the above-described materials are layered.

Figure 6C:
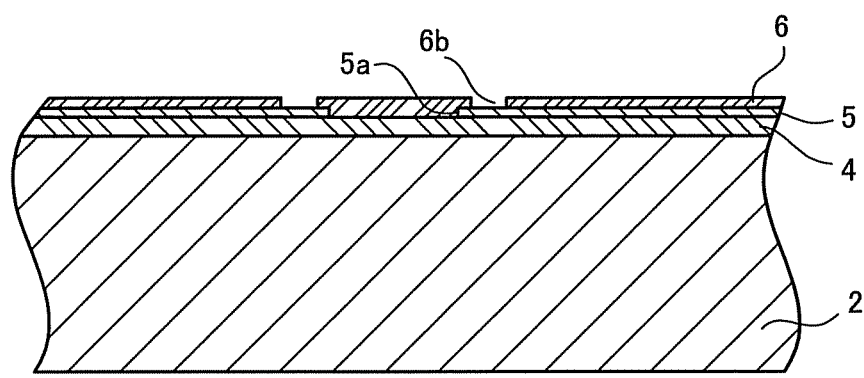

Subsequently, in a third step shown in FIG. 6C, on the first wiring layer 5 and on the first insulating layer 4 in the opening 5a that is the region where the first wiring layer 5 is not formed, the second insulating layer 6 having the annular connection opening portion 6b at a predetermined position (on the first wiring layer 5) is formed by the CVD method, spin coating method, spray coating method or the like. The second insulating layer 6 is comprised of, for example, silicon oxide, silicon nitride, SiOF, porous SiOC or the like.

Figure 6D:
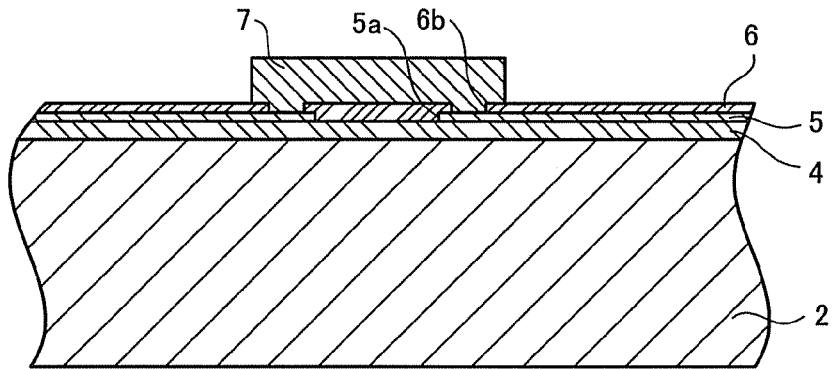

In a fourth step shown in FIG. 6D, on the second insulating layer 6 above the opening 5a of the first wiring layer 5, the second wiring layer 7 is formed to electrically contact the first wiring layer 5 via the connection opening portion 6b. The second wiring layer 7 is formed by the sputtering method, CVD method, vapor deposition method, plating method or the like using a mask in a predetermined pattern (not shown). The second wiring layer 7 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag or the like), or has a structure in which a plurality of layers comprised of the above-described materials are layered.

Figure 6E:
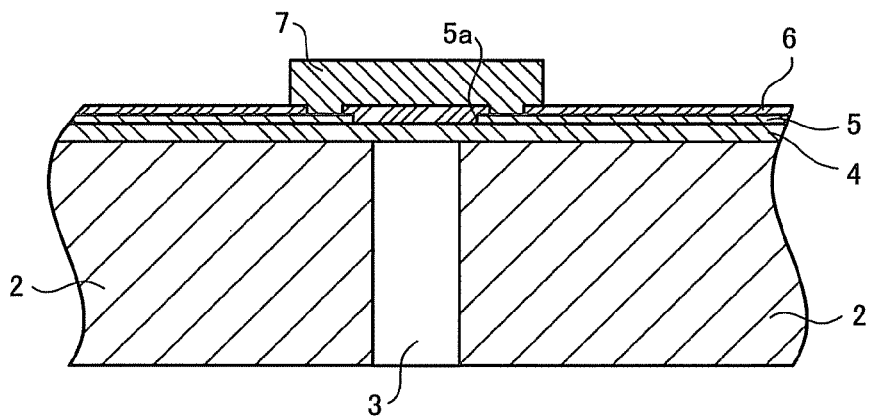

In a fifth step shown in FIG. 6E, the through hole 3 is formed, in a region where the large-diameter opening 5a of the first wiring layer 5 is formed, by the plasma etching method using a mask in a predetermined pattern (not shown) from the rear surface side of the semiconductor substrate 2 so as to expose the first insulating layer 4 at the bottom of the through hole 3. Note that the through hole 3 preferably has a cross section exhibiting a tapered shape decreasing in diameter toward the first insulating layer 4. In the formation of the through hole 3, the plasma etching is performed by introducing an etching gas into plasma so that the semiconductor substrate 2 is etched more greatly than the first insulating layer 4. Used as the etching gas is, for example, a mixed gas of $SF_6$ and $O_2$ and Ar for the case where the semiconductor substrate 2 is a silicon substrate and the first insulating layer 4 is a $SiO_2$ film.

Figure 6F:
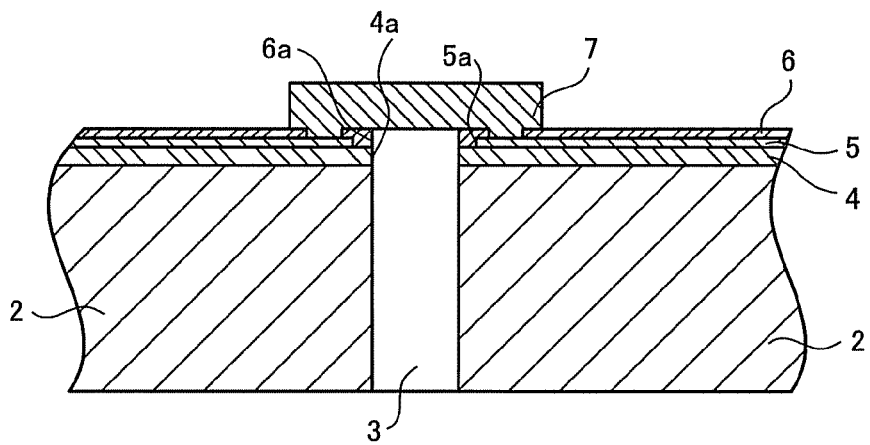

Subsequently, in a sixth step shown in FIG. 6F, the openings 4a and 6a are continuously formed by the plasma etching in the exposed portion of the first insulating layer 4 exposed by the formation of the through hole 3 and in the second insulating layer 6 thereon to expose the second wiring layer 7. The plasma etching is performed by introducing an etching gas (for example, a mixed gas of $C_5F_8$ and $O_2$ and Ar in the case where the first insulating layer 4 is a $SiO_2$ film, the second insulating layer 6 is a $SiO_2$ film, the semiconductor substrate 2 is a silicon substrate, and the second wiring layer 7 is made of TiW or Au) into plasma so that the first insulating layer 4 and the second insulating layer 6 are etched more greatly than the semiconductor substrate 2 and the second wiring layer 7.

Alternatively, the above-described fifth step and sixth step can be performed together by the laser etching method without using the mask. Used as a laser light source is, for example, a YAG laser, UV laser, excimer laser, carbon dioxide gas ($CO_2$) laser or the like. Where the semiconductor substrate 2 is a silicon substrate, the first insulating layer 4 is a $SiO_2$ film, and the second insulating layer 6 is a $SiO_2$ film, the YAG laser with a frequency of 355 nm is preferably used as the laser light source.

Figure 6G:
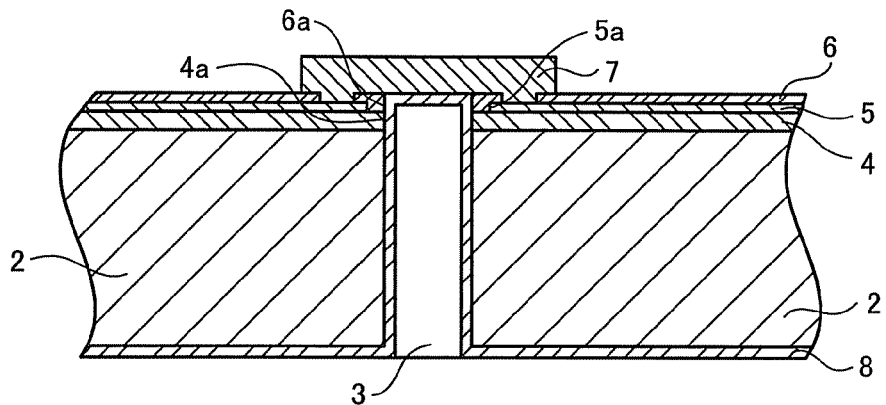

Subsequently, in a seventh step shown in FIG. 6G, the third insulating layer 8 is formed by the CVD method, spray coating method, spin coating method, film laminating method or the like, to cover the bottom surface (the exposed portion of the second wiring layer 7) and the inner wall surface of the through hole 3 to the rear surface of the semiconductor substrate 2. The third insulating layer 8 is composed of, for example, silicon oxide, silicon nitride, polyimide resin, BCB (benzocyclobutene) resin, epoxy resin or the like.

Figure 6H:
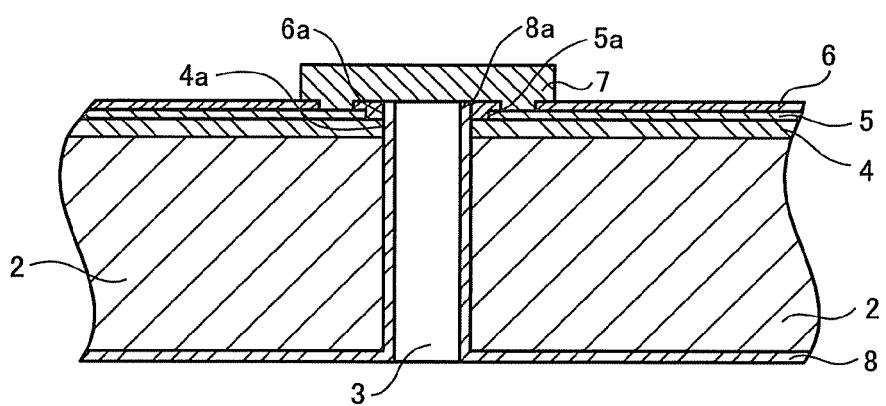

In an eighth step shown in FIG. 6H, the opening 8a having substantially the same diameter as those of the opening 4a of the first insulating layer 4 and the opening 6a of the second insulating layer 6 is formed in the third insulating layer 8 formed on the bottom surface of the through hole 3 by the plasma etching using a mask in a predetermined pattern (not shown) to expose again the second wiring layer 7. In the formation of the opening 8a, the plasma etching is performed by introducing an etching gas (for example, a mixed gas of $C_5F_8$ and $O_2$ and Ar in the case where the third insulating layer 8 is a $SiO_2$ film, the second wiring layer 7 is made of TiW or Au) into plasma so that the third insulating layer 8 is etched more greatly than the second wiring layer 7.

Figure 6I:
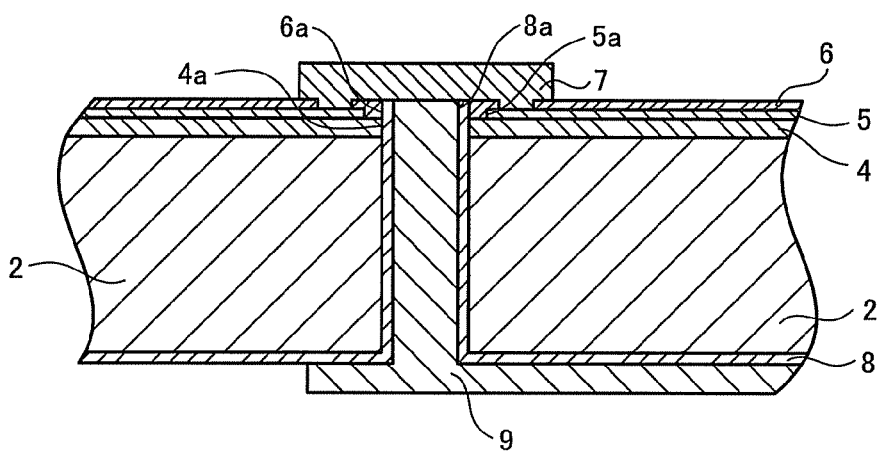

Subsequently, in a ninth step shown in FIG. 6I, the third wiring layer 9 is formed from on the third insulating layer 8 in the through hole 3 to on the third insulating layer 8 on the rear surface of the semiconductor substrate 2 to internally contact the second wiring layer 7 via the opening 8a of the third insulating layer 8. The third wiring layer 9 is a single layer comprised of a high-resistance metal (Ti, TiN, TiW, Ni, Cr, TaN, CoWP or the like) or a low-resistance metal (Al, Al—Cu, Al—Si—Cu, Cu, Au, Ag, solder or the like), or has a structure in which a plurality of layers comprised of the above-described materials are layered. The formation of the third wiring layer 9 is preferably performed by the sputtering method, CVD method, vapor deposition method, plating method, printing method or the like using a mask in a predetermined pattern (not shown) to fill the inside of the through hole 3.

Figure 6J:
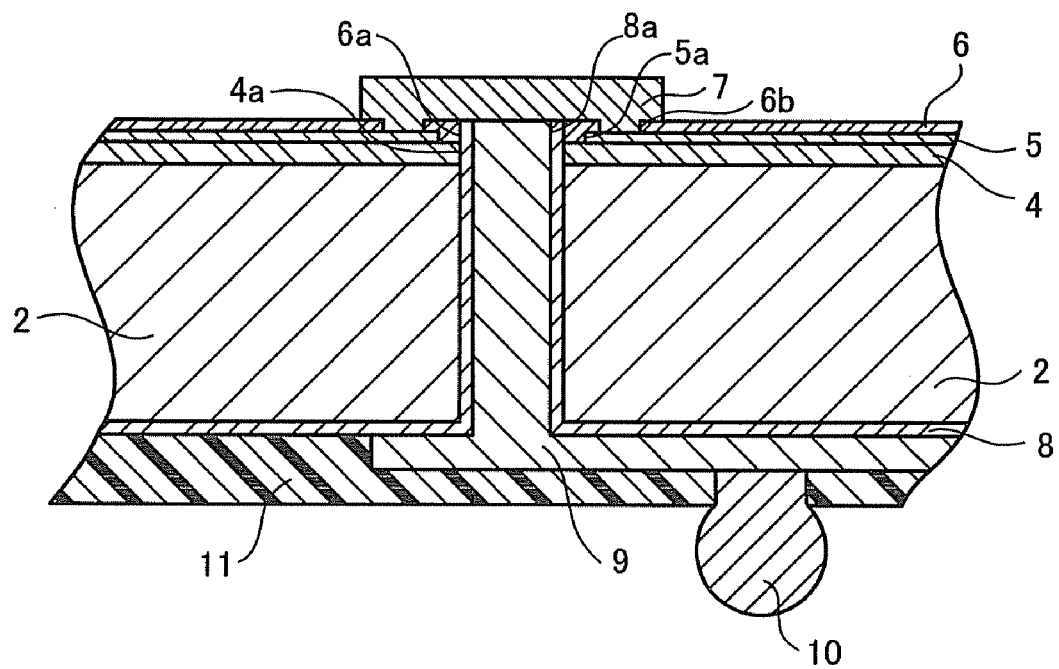

Then, in a tenth step shown in FIG. 6J, the external terminal 10 is formed on the third wiring layer 9 on the rear surface of the semiconductor substrate 2, and the protective layer 11 is formed on the third wiring layer 9 except the portion where the external terminal 10 is formed and on the third insulating layer 8 on the rear surface side. The external terminal 10 is formed of, for example, a solder material, and the protective layer 11 is formed of a polyimide resin, epoxy resin or solder resist material. Subsequently, the semiconductor substrate 2 is diced by a cutting blade of a dicer. Thus, the individual piece of the semiconductor device 1 shown in FIG. 5 is obtained.

In the semiconductor device 1 of the third embodiment manufactured as described above, the first wiring layer 5 formed on the front surface of the semiconductor substrate 2 has the opening 5a, and the through connection portion constituted of the through hole 3 and the third insulating layer 8 formed on its inner wall surface and so on and the third wiring layer 9 filled and formed in the through hole 3 are formed in the region of the opening 5a. Further, the second wiring layer 7 internally contacting the through connection portion is connected with the first wiring layer 5 via the annular connection opening portion 6b formed in the second insulating layer 6. As described above, at the opening portion on the front surface side of the through hole 3, the second insulating layer 6 is formed to intervene between the inner wall surface of the through hole 3 and the first wiring layer 5 so that the first wiring layer 5 is separated from the third wiring layer 9 filled and formed in the through hole 3, thereby preventing the wiring layer 5 from being eroded during opening of the first insulating layer 4 and the second insulating layer 6, resulting in increased yields. The separation distance between the first wiring layer 5 and the third wiring layer 9 that is equal to or greater than 50 nm when the second insulating layer 6 is comprised of, for example, $SiO_2$ prevents occurrence of electrostatic breakdown between the third wiring layer 9 and the first wiring layer 5, resulting in excellent electrical reliability.

Moreover, the second wiring layer 7 is formed protruding from the second insulating layer 6 and thus has a function as a reinforcing structure at the opening portion on the front surface side of the through hole 3, thereby presenting a semiconductor device having excellent mechanical reliability. Furthermore, all of the through hole 3, the opening 4a of the first insulating layer 4, the opening 5a of the first wiring layer 5, and the opening 6a of the second insulating layer 6 are coaxially arranged, so that when the semiconductor substrate 2 is viewed from the rear surface side, the area occupied by the through connection portion can be reduced. Accordingly, larger numbers of through holes 3 and through connection portions can be located than those in the first embodiment.

Next, a fourth embodiment of the present invention will be described.

Figure 7:
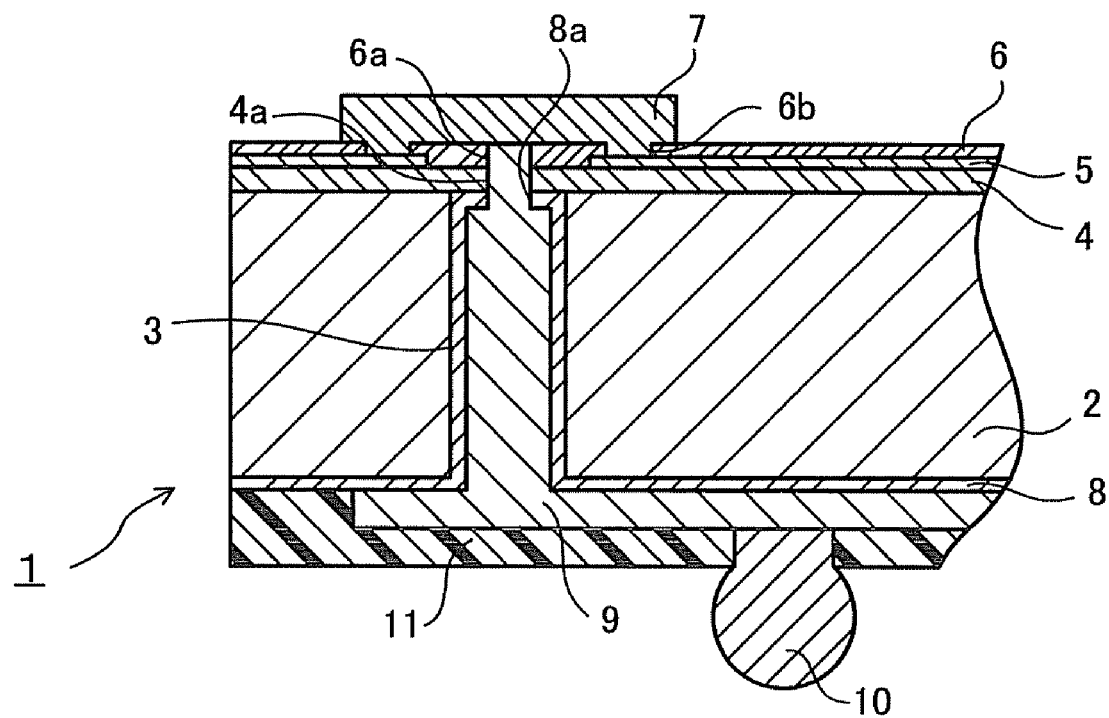
FIG. 7 is a cross-sectional view showing a configuration of a semiconductor device according to a fourth embodiment of the present invention.
Figure 8:
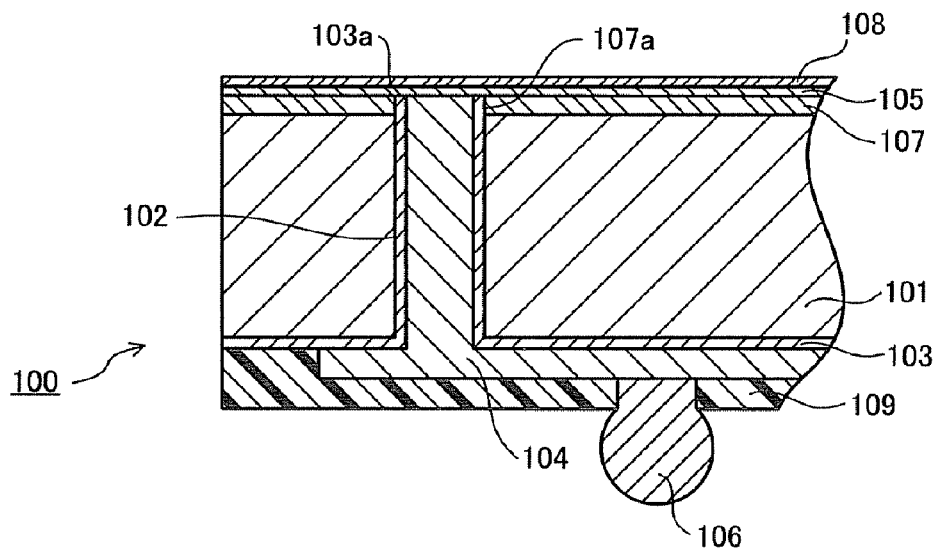
FIG. 8 is a cross-sectional view showing a configuration of a conventional semiconductor device.

As shown in FIG. 7, in a semiconductor device 1 of the fourth embodiment, an opening 4a of a first insulating layer 4 and an opening 6a of a second insulating layer 6 are formed smaller than the diameter (the inner diameter) of a through hole 3, and are formed coaxially with the through hole 3. Further, a third insulating layer 8 is formed to internally contact the first insulating layer 4, and is formed with an opening 8a having the same diameter as those of the first opening 4a of the first insulating layer 4 and the opening 6a of the second insulating layer 6, in the internal contact portion of the third insulating layer 8. Further, the opening 8a of the third insulating layer 8 is formed coaxially with the opening 4a of the first insulating layer 4 and the opening 6a of the second insulating layer 6. The remaining configuration in the semiconductor device 1 of the fourth embodiment is the same as that of the third embodiment shown in FIG. 5, and therefore the description thereof will be omitted.

The semiconductor device 1 of the fourth embodiment configured as described above can be manufactured by implementing the process similar to the first to fifth steps (shown in FIG. 6A to FIG. 6E) in the method of manufacturing the semiconductor device 1 of the third embodiment, and then implementing the process similar to the steps shown in FIG. 4A to FIG. 4D in the method of manufacturing the semiconductor device of the second embodiment.

In the semiconductor device 1 of the fourth embodiment configured as described above, the opening 4a of the first insulating layer 4 and the opening 6a of the second insulating layer 6 are formed smaller than the diameter of the through hole 3, so that the second insulating layer 6 intervening between the inner wall surface of the through hole 3 and the first wiring layer 5 separates the first wiring layer 5 further from the third wiring layer 9 filled and formed in the through hole 3 than in the third embodiment. This more surely prevents the first wiring layer 5 from being eroded during opening of the first insulating layer 4 and the second insulating layer 6, resulting in further increased yields than in the third embodiment. The separation distance between the first wiring layer 5 and the third wiring layer 9 that is equal to or greater than 50 nm when the second insulating layer 6 is comprised of, for example, $SiO_2$ prevents occurrence of electrostatic breakdown between the third wiring layer 9 and the first wiring layer 5, resulting in excellent electrical reliability.

The configuration, shape, size and positional relation described in the above embodiments are only schematically indicated and the numerical values and compositions (materials) of components are just illustrative. Accordingly, the present invention is not limited to the above embodiments, and can be modified in various forms as long as they do not depart from the scope of the technical spirit as set forth in claims.

What is claimed is:

1. A semiconductor device comprising:
   a semiconductor substrate;
   a through hole formed penetrating through a first surface and a second surface of said semiconductor substrate;
   a first insulating layer having an opening above an opening portion on the first surface side of said through hole, formed on the first surface of said semiconductor substrate;
   a first conductor layer in a pattern formed in a region where the opening is not formed on said first insulating layer;
   a second insulating layer having an opening above the opening portion on the first surface side of said through hole, formed to cover said first conductor layer and said first insulating layer in a region where said first conductor layer is not formed;
   a second conductor layer electrically connected with said first conductor layer, formed on said second insulating layer to cover the opening of said second insulating layer;
   a third insulating layer having a first portion formed on the second surface of said semiconductor substrate, a second portion formed in said through hole, and a third portion formed on the rear surface of the first insulating layer, the first, second, and third portions being connected with each other, the third portion having an opening; and
   a third conductor layer internally contacting said second conductor layer via the opening of said third insulating layer, continuously formed in said through hole and on said third insulating layer on the second surface of said semiconductor substrate,
   wherein the opening of said first insulating layer and the opening of said second insulating layer are smaller in diameter than said through hole and formed coaxially with said through hole,
   wherein the opening of the third portion of said third insulating layer is the same in diameter as the opening of said first insulating layer and the opening of said second insulating layer and formed coaxially with these openings.

2. A semiconductor device comprising:
   a semiconductor substrate;
   a through hole formed penetrating through a first surface and a second surface of said semiconductor substrate;
   a first insulating layer having an opening above an opening portion on the first surface side of said through hole, formed on the first surface of said semiconductor substrate;
   a first conductor layer having an opening larger in diameter than the opening of said first insulating layer, the opening of the first conductor layer being formed coaxially above the opening portion on the first surface side of said through hole, formed on said first insulating layer;
   a second insulating layer having an opening smaller in diameter than the opening of said first conductor layer, the opening of the second insulating layer being formed coaxially above the opening portion on the first surface side of said through hole, formed to cover said first conductor layer and said first insulating layer in a region where said first conductor layer is not formed;
   a second conductor layer electrically connected with said first conductor layer, formed on said second insulating layer to cover the opening of said second insulating layer;
   a third insulating layer having a first portion formed on the second surface of said semiconductor substrate, a second portion formed in said through hole, and a third portion formed on the rear surface of the first insulating film layer, the first, second, and third portions being connected with each other, the third portion having an opening; and
   a third conductor layer internally contacting said second conductor layer via the opening of said third insulating layer, continuously formed in said through hole and on said third insulating layer on the second surface of said semiconductor substrate,
   wherein the opening of said first insulating layer and the opening of said second insulating layer are smaller in diameter than said through hole and formed coaxially with said through hole,
   wherein the opening of the third portion of said third insulating layer is the same in diameter as the opening of said first insulating layer and the opening of said second insulating layer and formed coaxially with these openings.

* * * * *